US010763793B2

(12) United States Patent
Wu et al.

(10) Patent No.: US 10,763,793 B2
(45) Date of Patent: Sep. 1, 2020

(54) DUAL-MODE SIGNAL AMPLIFYING CIRCUIT OF SIGNAL RECEIVER

(71) Applicant: Realtek Semiconductor Corp., Hsinchu (TW)

(72) Inventors: Chao-Huang Wu, Taoyuan (TW); Yi-Shao Chang, Kaohsiung (TW); Han-Chang Kang, Hsinchu (TW); Ka-Un Chan, Hsinchu County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 56 days.

(21) Appl. No.: 16/161,500

(22) Filed: Oct. 16, 2018

(65) Prior Publication Data

US 2019/0140601 A1 May 9, 2019

(30) Foreign Application Priority Data

Nov. 3, 2017 (TW) .............................. 106138207 A

(51) Int. Cl.
*H03F 1/26* (2006.01)
*H03F 3/45* (2006.01)
*H03F 1/08* (2006.01)
*H03G 5/16* (2006.01)
*H04B 1/10* (2006.01)
*H03G 5/28* (2006.01)
*H03K 17/687* (2006.01)

(52) U.S. Cl.
CPC ........... *H03F 1/26* (2013.01); *H03F 3/45179* (2013.01); *H03G 5/16* (2013.01); *H03G 5/28* (2013.01); *H04B 1/10* (2013.01); *H03K 17/687* (2013.01)

(58) Field of Classification Search
USPC .................................................. 330/252–261
See application file for complete search history.

(56) References Cited

U.S. PATENT DOCUMENTS 9,479,120 B2 * 10/2016 Cho ........................ H03F 1/083
10,594,278 B2 * 3/2020 Tripathi ................ H03F 3/4573

OTHER PUBLICATIONS

Harrison et al., "ISSCC paper: A 500MHz CMOS Anti-Alias Filter using Feed-Forward OP-amps with Local Common-Mode Feedback", IEEE 2003, Australia, total 9 pages.

* cited by examiner

*Primary Examiner* — Hieu P Nguyen
(74) *Attorney, Agent, or Firm* — Birch, Stewart, Kolasch & Birch, LLP

(57) ABSTRACT

A dual-mode signal amplifying circuit includes: a first and a second input terminals for receiving differential input signals; two output terminals for providing differential output signals; a first through a third current sources; a first switch positioned between the first current source and a first node, and controlled by the first input terminal; a second switch positioned between the first current source and a second node, and controlled by the second input terminal; a third switch positioned between the first node and a fixed-voltage terminal, and controlled by a third node; a fourth switch positioned between the second node and a fixed-voltage terminal, and controlled by the third node; a fifth switch positioned between the second current source and a fixed-voltage terminal, and controlled by the first node; and a sixth switch positioned between the third current source and a fixed-voltage terminal, and controlled by the second node.

8 Claims, 2 Drawing Sheets

DUAL-MODE SIGNAL AMPLIFYING CIRCUIT OF SIGNAL RECEIVER

CROSS-REFERENCE TO RELATED APPLICATIONS

This application claims the benefit of priority to Patent Application No. 106138207, filed in Taiwan on Nov. 3, 2017; the entirety of which is incorporated herein by reference for all purposes.

BACKGROUND

The disclosure generally relates to a signal receiver and, more particularly, to a dual-mode signal amplifying circuit of a signal receiver.

The interference caused by out-of-band signals may reduce the operating performance of a signal receiver. Increasing the unity gain bandwidth of the signal amplifying circuit within the signal receiver can increase the signal receiver's immunity to the out-of-band interference. The unity gain bandwidth of a conventional signal amplifying circuit can be increased by reducing the capacitance of the compensation capacitors in the conventional signal amplifying circuit. But the side effect of such approach is that the stability of the signal amplifying circuit would be degraded, thereby adversely affecting the operating performance of the signal receiver.

SUMMARY

In view of the foregoing, it may be appreciated that a substantial need exists for methods and apparatuses that mitigate or reduce the problems above.

An example embodiment of a dual-mode signal amplifying circuit of a signal receiver is disclosed, comprising: a first input terminal arranged to operably receive a first input signal; a second input terminal arranged to operably receive a second input signal; a first output terminal arranged to operably provide a first output signal; a second output terminal arranged to operably provide a second output signal; a first current source arranged to operably generate a first current according to a biasing signal; a second current source arranged to operably generate a second current according to the biasing signal; a third current source arranged to operably generate a third current according to the biasing signal; a first switch positioned between an output terminal of the first current source and a first node, and arranged to operate under control of the first input terminal; a second switch positioned between the output terminal of the first current source and a second node, and arranged to operate under control of the second input terminal; a third switch positioned between the first node and a fixed-voltage terminal, and arranged to operate under control of a third node; a fourth switch positioned between the second node and a fixed-voltage terminal, and arranged to operate under control of the third node; a fifth switch positioned between an output terminal of the second current source and a fixed-voltage terminal, and arranged to operate under control of the first node; a sixth switch positioned between an output terminal of the third current source and a fixed-voltage terminal, and arranged to operate under control of the second node; a fourth current source arranged to operably generate a fourth current according to the biasing signal; a seventh switch positioned between an output terminal of the fourth current source and the second output terminal, and arranged to operate under control of the first input terminal; and an eighth switch positioned between the output terminal of the fourth current source and the first output terminal, and arranged to operate under control of the second input terminal.

Another example embodiment of a dual-mode signal amplifying circuit of a signal receiver is disclosed, comprising: a first input terminal arranged to operably receive a first input signal; a second input terminal arranged to operably receive a second input signal; a first output terminal arranged to operably provide a first output signal; a second output terminal arranged to operably provide a second output signal; a first current source arranged to operably generate a first current according to a biasing signal; a second current source arranged to operably generate a second current according to the second input signal; a third current source arranged to operably generate a third current according to the first input signal; a first switch positioned between an output terminal of the first current source and a first node, and arranged to operate under control of the first input terminal; a second switch positioned between the output terminal of the first current source and a second node, and arranged to operate under control of the second input terminal; a third switch positioned between the first node and a fixed-voltage terminal, and arranged to operate under control of a third node; a fourth switch positioned between the second node and a fixed-voltage terminal, and arranged to operate under control of the third node; a fifth switch positioned between an output terminal of the second current source and a fixed-voltage terminal, and arranged to operate under control of the first node; and a sixth switch positioned between an output terminal of the third current source and a fixed-voltage terminal, and arranged to operate under control of the second node.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
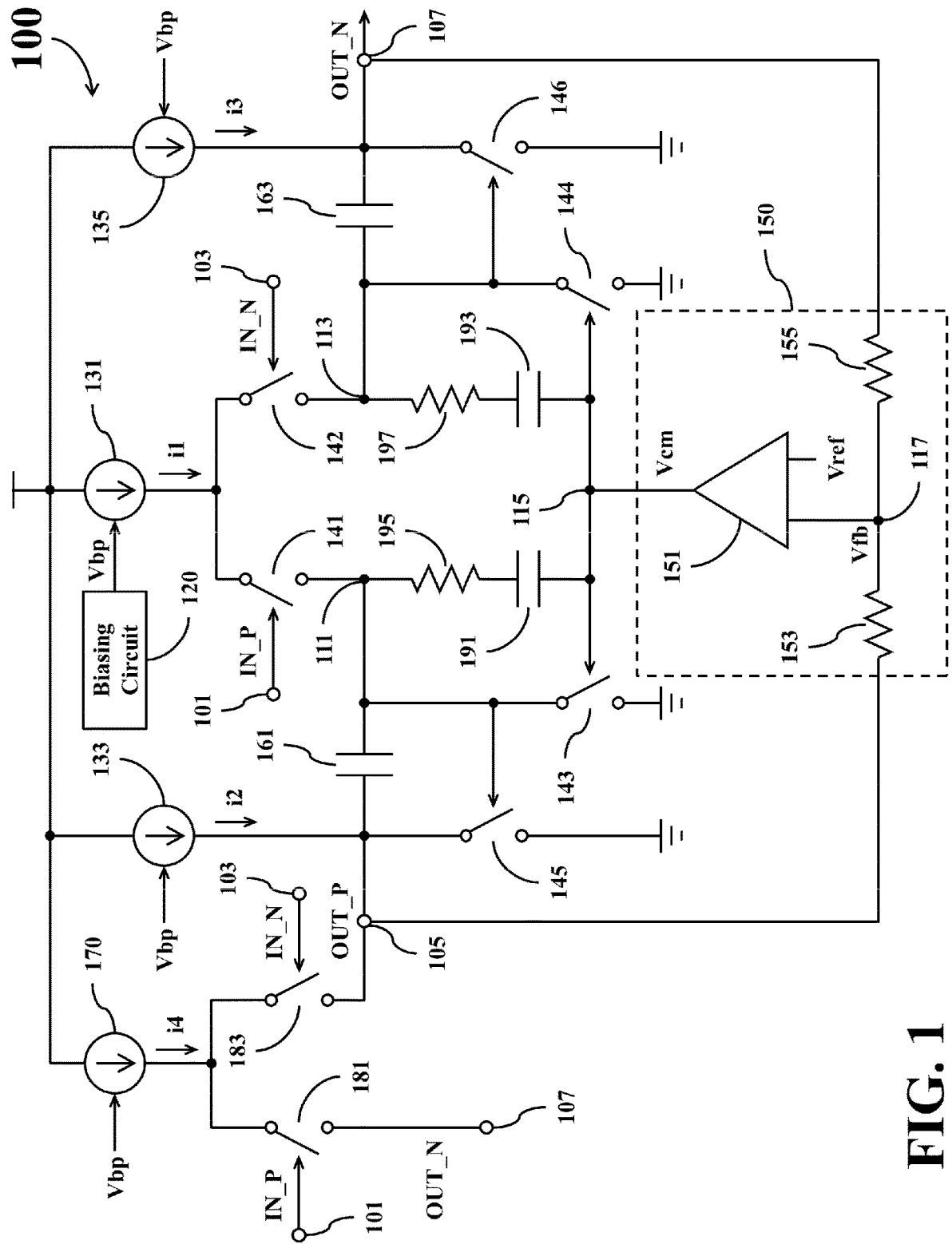
FIG. 1 shows a simplified functional block diagram of a dual-mode signal amplifying circuit according to one embodiment of the present disclosure.

FIG. 1 shows a simplified functional block diagram of a dual-mode signal amplifying circuit 100 according to one embodiment of the present disclosure. The dual-mode signal amplifying circuit 100 can be applied in a signal receiver and capable of conducting a differential mode operation and a common mode operation.

As shown in FIG. 1, the dual-mode signal amplifying circuit 100 comprises a first input terminal 101, a second input terminal 103, a first output terminal 105, a second output terminal 107, a biasing circuit 120, a first current source 131, a second current source 133, a third current source 135, a first switch 141, a second switch 142, a third switch 143, a fourth switch 144, a fifth switch 145, a sixth switch 146, a common-mode feedback circuit 150, a first compensation capacitor 161, and a second compensation capacitor 163.

The first input terminal 101 is arranged to operably receive a first input signal IN_P. The second input terminal 103 is arranged to operably receive a second input signal IN_N. The first output terminal 105 is arranged to operably provide a first output signal OUT_P. The second output terminal 107 is arranged to operably provide a second output signal OUT_N. The aforementioned first input signal IN_P and second input signal IN_N for a pair of differential input signals, while the aforementioned first output signal OUT_P and second output signal OUT_N form a pair of differential output signals.

The biasing circuit 120 is arranged to operably generate a biasing signal Vbp. The first current source 131 is arranged to operably generate a first current i1 according to the biasing signal Vbp. The second current source 133 is arranged to operably generate a second current i2 according to the biasing signal Vbp. The third current source 135 is arranged to operably generate a third current i3 according to the biasing signal Vbp.

The first switch 141 is positioned between the output terminal of the first current source 131 and a first node 111, and arranged to operate under control of the first input terminal 101. The second switch 142 is positioned between the output terminal of the first current source 131 and a second node 113, and arranged to operate under control of the second input terminal 103. The third switch 143 is positioned between the first node 111 and a fixed-voltage terminal (such as a ground terminal), and arranged to operate under control of a third node 115. The fourth switch 144 is positioned between the second node 113 and a fixed-voltage terminal (such as a ground terminal), and arranged to operate under control of the third node 115. The fifth switch 145 is positioned between the output terminal of the second current source 133 and a fixed-voltage terminal (such as a ground terminal), and arranged to operate under control of the first node 111. The sixth switch 146 is positioned between the output terminal of the third current source 135 and a fixed-voltage terminal (such as a ground terminal), and arranged to operate under control of the second node 113.

The common-mode feedback circuit 150 is coupled with the first output terminal 105 and the second output terminal 107, and arranged to generate and output a feedback signal Vcm to the third node 115 based on the first output signal OUT_P and the second output signal OUT_N, so as to decide the DC (direct current) level of the common mode voltage of the dual-mode signal amplifying circuit 100.

The first compensation capacitor 161 is positioned between the first node 111 and the first output terminal 105, while the second compensation capacitor 163 is positioned between the second node 113 and the second output terminal 107. For example, in the embodiment of FIG. 1, one terminal of the first compensation capacitor 161 is coupled with the first node 111, while another terminal of the first compensation capacitor 161 is coupled with the first output terminal 105 and the output terminal of the second current source 133. One terminal of the second compensation capacitor 163 is coupled with the second node 113, while another terminal of the second compensation capacitor 163 is coupled with the second output terminal 107 and the output terminal of the third current source 135.

It can be appreciated from FIG. 1 that the first switch 141 and the third switch 143 are configured in series connection, and the first node 111 is positioned between the first switch 141 and the third switch 143. The second switch 142 and the fourth switch 144 are configured in series connection, and the second node 113 is positioned between the second switch 142 and the fourth switch 144. The third switch 143 and the fifth switch 145 are configured in parallel connection, and the first output terminal 105 is coupled between the output terminal of the second current source 133 and the fifth switch 145. The fourth switch 144 and the sixth switch 146 are configured in parallel connection, and the second output terminal 107 is coupled between the output terminal of the third current source 135 and the sixth switch 146.

In order to effectively increase the unity gain bandwidth of the dual-mode signal amplifying circuit 100, the first compensation capacitor 161 and the second compensation capacitor 163 described previously may be realized with smaller capacitors to reduce the capacitance thereof. As a result, the signal receiver in which the dual-mode signal amplifying circuit 100 can have increased immunity to the out-of-band interference.

Please note that the dual-mode signal amplifying circuit 100 in the embodiment of FIG. 1 further comprises a fourth current source 170, a seventh switch 181, and an eighth switch 183.

The fourth current source 170 is arranged to operably generate a fourth current i4 according to the biasing signal Vbp. The seventh switch 181 is positioned between the output terminal of the fourth current source 170 and the second output terminal 107, and arranged to operate under control of the first input terminal 101. The eighth switch 183 is positioned between the output terminal of the fourth current source 170 and the first output terminal 105, and arranged to operate under control of the second input terminal 103.

The presence of the fourth current source 170, the seventh switch 181, and the eighth switch 183 can equivalently increase the transconductance value between the input terminal of the dual-mode signal amplifying circuit 100 and the output terminal of the dual-mode signal amplifying circuit 100, and thus the stability of the differential mode operation of the dual-mode signal amplifying circuit 100 can be effectively increased.

In addition, the dual-mode signal amplifying circuit 100 in the embodiment of FIG. 1 further comprises a first capacitor 191 and a second capacitor 193. The first capacitor 191 is positioned between the first node 111 and the third node 115, while the second capacitor 193 is positioned between the second node 113 and the third node 115.

The presence of the first capacitor 191 and the second capacitor 193 can increase the capacitance value in the signal feedback path of the dual-mode signal amplifying circuit 100, and thus the stability of the common mode operation of the dual-mode signal amplifying circuit 100 can be effectively increased.

In implementations, a first resistor 195 configured in series connection with the first capacitor 191 may be arranged between the first node 111 and the third node 115, while a second resistor 197 configured in series connection with the second capacitor 193 may be arranged between the second node 113 the third node 115, so as to further increase the stability of the common mode operation of the dual-mode signal amplifying circuit 100.

In practice, each of the current sources 131, 133, 135, 170, and the switches 141, 142, 143, 144, 145, and 146 may be realized with appropriate field effect transistors.

The common-mode feedback circuit 150 may be realized with an appropriate comparator. For example, in the embodiment of FIG. 1, the common-mode feedback circuit 150 comprises a comparator 151, a first feedback resistor 153, and a second feedback resistor 155. The first feedback resistor 153 is coupled between the first output terminal 105 and a fourth node 117, while the second feedback resistor 155 is coupled between the second output terminal 107 and the fourth node 117. By properly choosing the resistance values of the first feedback resistor 153 and the second feedback resistor 155, a common-mode voltage signal Vfb having appropriate magnitude can be obtained at the fourth node 117. The comparator 151 is coupled with the third node 115, and arranged to operably compare the common-mode voltage signal Vfb with a predetermined reference signal Vref to generate the aforementioned feedback signal Vcm.

It can be appreciated from the foregoing elaborations that the circuitry combination of the fourth current source 170, the seventh switch 181, and the eighth switch 183 in the dual-mode signal amplifying circuit 100 can effectively increase the stability of the differential mode operation of the dual-mode signal amplifying circuit 100, while the circuitry combination of the first capacitor 191, the second capacitor 193, the first resistor 195, and the second resistor 197 can effectively increase the stability of the common mode operation of the dual-mode signal amplifying circuit 100.

Therefore, the first compensation capacitor 161 and the second compensation capacitor 163 in the disclosed dual-mode signal amplifying circuit 100 can be minimized to effectively increase the unity gain bandwidth of the dual-mode signal amplifying circuit 100, thereby increasing the related signal receiver's immunity to out-of-band interference.

In other words, the structure of the disclosed dual-mode signal amplifying circuit 100 not only increases the unity gain bandwidth of the dual-mode signal amplifying circuit 100, but also maintains or increases the stability of the dual-mode signal amplifying circuit 100 when conducting the differential mode operation and/or the common mode operation.

Figure 2:
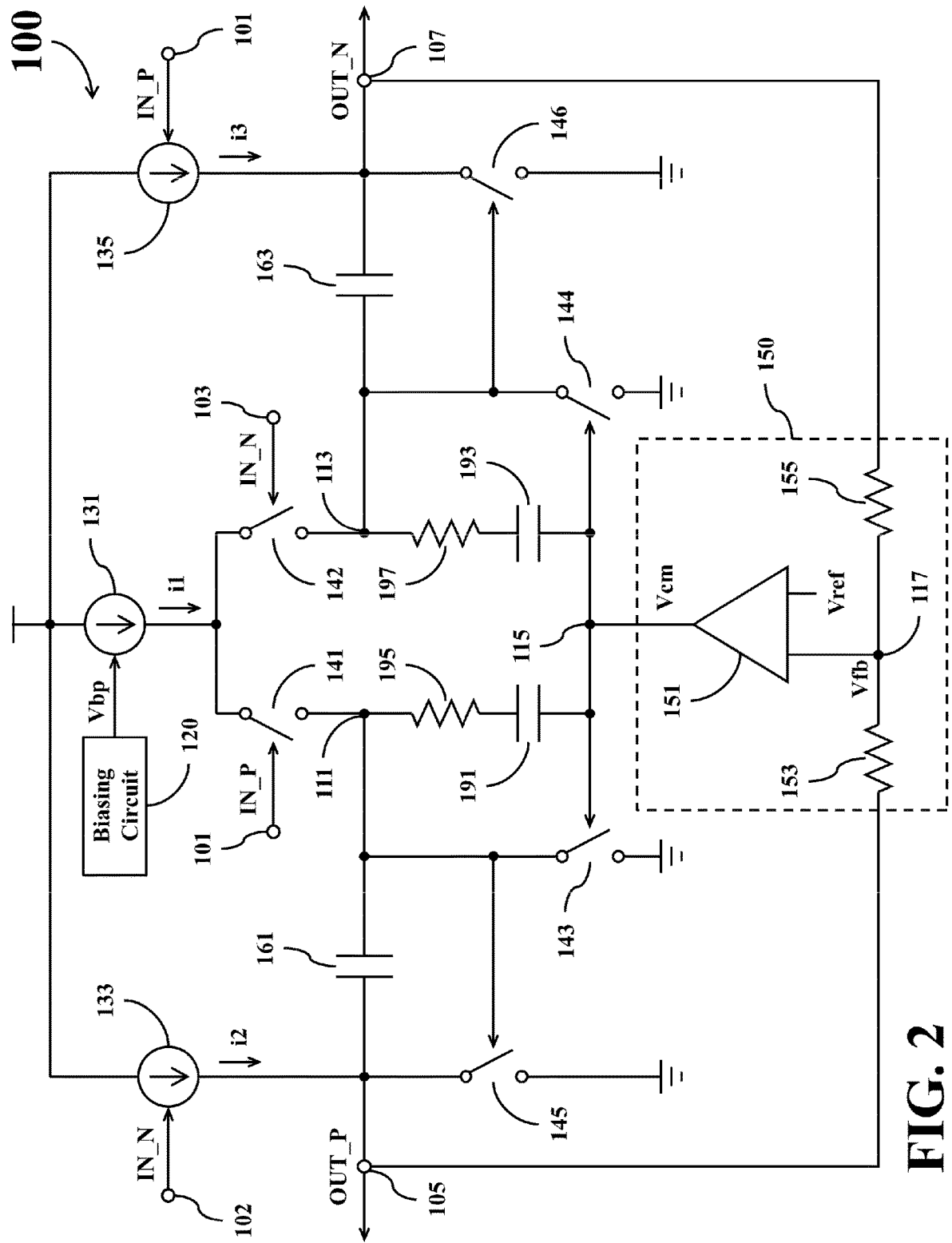
FIG. 2 shows a simplified functional block diagram of a dual-mode signal amplifying circuit according to another embodiment of the present disclosure.

FIG. 2 shows a simplified functional block diagram of the dual-mode signal amplifying circuit 100 according to another embodiment of the present disclosure.

The embodiment of FIG. 2 is similar to the aforementioned embodiment of FIG. 1, but the fourth current source 170, the seventh switch 181, and the eighth switch 183 in FIG. 1 are omitted in the embodiment of FIG. 2.

Additionally, in the embodiment of FIG. 2, the second input signal IN_N is employed as the control signal of the second current source 133, while the first input signal IN_P is employed as the control signal of the third current source 135. In other words, in the embodiment of FIG. 2, the second current source 133 is arranged to operably generate the second current i2 according to the second input signal IN_N, while the third current source 135 is arranged to operably generate the third current i3 according to the first input signal IN_P.

By adopting the control mechanism shown in FIG. 2 to control the second current source 133 and the third current source 135, the transconductance value between the input terminal of the dual-mode signal amplifying circuit 100 and the output terminal of the dual-mode signal amplifying circuit 100 can be effectively increased as well. Accordingly, the embodiment of FIG. 2 can effectively increase the stability of the differential mode operation of the dual-mode signal amplifying circuit 100.

The foregoing descriptions regarding the connections, implementations, operations, and related advantages of other corresponding components in FIG. 1 are also applicable to the embodiment of FIG. 2. For the sake of brevity, those descriptions will not be repeated here.

Please note that the structures shown in FIG. 1 and FIG. 2 are exemplary examples, rather than a restriction to practical implementations. For example, in some embodiments, the first compensation capacitor 161 and the second compensation capacitor 163 in the dual-mode signal amplifying circuit 100 can even be realized with parasitic capacitors within the circuitry. In this situation, no physical compensation capacitor is required in the dual-mode signal amplifying circuit 100.

In some embodiments where the requirement to common mode stability is low, the first resistor 195 and the second resistor 197 may be omitted. In some embodiments where the common mode stability is not a concern, the first capacitor 191 and the second capacitor 193 described above may be omitted.

It can be appreciated from the foregoing descriptions that the compensation capacitors in the dual-mode signal amplifying circuit 100 can be minimized or can be even omitted, so the unity gain bandwidth of the dual-mode signal amplifying circuit 100 can be effectively increased, thereby increasing related signal receiver's immunity to the out-of-band interference.

In addition, the cooperation of the fourth current source 170, the seventh switch 181, and the eighth switch 183 can effectively increase the stability of the dual-mode signal amplifying circuit 100 when conducting the differential mode operation. Therefore, the reduced capacitance of the compensation capacitors in the dual-mode signal amplifying circuit 100 does not adversely affect the operating performance of related signal receiver.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A dual-mode signal amplifying circuit (100) of a signal receiver, comprising:
   a first input terminal (101) arranged to operably receive a first input signal (IN_P);
   a second input terminal (103) arranged to operably receive a second input signal (IN_N);
   a first output terminal (105) arranged to operably provide a first output signal (OUT_P);

a second output terminal (107) arranged to operably provide a second output signal (OUT_N);

a first current source (131) arranged to operably generate a first current (i1) according to a biasing signal (Vbp);

a second current source (133) arranged to operably generate a second current (i2) according to the biasing signal (Vbp);

a third current source (135) arranged to operably generate a third current (i3) according to the biasing signal (Vbp);

a first switch (141) positioned between an output terminal of the first current source (131) and a first node (111), and arranged to operate under control of the first input terminal (101);

a second switch (142) positioned between the output terminal of the first current source (131) and a second node (113), and arranged to operate under control of the second input terminal (103);

a third switch (143) positioned between the first node (111) and a fixed-voltage terminal, and arranged to operate under control of a third node (115);

a fourth switch (144) positioned between the second node (113) and a fixed-voltage terminal, and arranged to operate under control of the third node (115);

a fifth switch (145) positioned between an output terminal of the second current source (133) and a fixed-voltage terminal, and arranged to operate under control of the first node (111);

a sixth switch (146) positioned between an output terminal of the third current source (135) and a fixed-voltage terminal, and arranged to operate under control of the second node (113);

a fourth current source (170) arranged to operably generate a fourth current (i4) according to the biasing signal (Vbp);

a seventh switch (181) positioned between an output terminal of the fourth current source (170) and the second output terminal (107), and arranged to operate under control of the first input terminal (101); and an eighth switch (183) positioned between the output terminal of the fourth current source (170) and the first output terminal (105), and arranged to operate under control of the second input terminal (103).

2. The dual-mode signal amplifying circuit (100) of claim 1, further comprising:

a biasing circuit (120) arranged to operably generate the biasing signal (Vbp); and a common-mode feedback circuit (150) coupled with the first output terminal (105) and the second output terminal (107), and arranged to operably generate and output a feedback signal (Vcm) to the third node (115) based on the first output signal (OUT_P) and the second output signal (OUT_N).

3. The dual-mode signal amplifying circuit (100) of claim 2, wherein the first input signal (IN_P) and the second input signal (IN_N) form a pair of differential input signals, while the first output signal (OUT_P) and the second output signal (OUT_N) form a pair of differential output signals.

4. The dual-mode signal amplifying circuit (100) of claim 2, further comprising:

a first capacitor (191) positioned between the first node (111) and the third node (115); and a second capacitor (193) positioned between the second node (113) and the third node (115).

5. The dual-mode signal amplifying circuit (100) of claim 4, wherein the first input signal (IN_P) and the second input signal (IN_N) form a pair of differential input signals, while the first output signal (OUT_P) and the second output signal (OUT_N) form a pair of differential output signals.

6. The dual-mode signal amplifying circuit (100) of claim 4, further comprising:

a first resistor (195) positioned between the first node (111) and the third node (115), and configured in series connection with the first capacitor (191); and a second resistor (197) positioned between the second node (113) and the third node (115), and configured in series connection with the second capacitor (193).

7. The dual-mode signal amplifying circuit (100) of claim 6, wherein the first input signal (IN_P) and the second input signal (IN_N) form a pair of differential input signals, while the first output signal (OUT_P) and the second output signal (OUT_N) form a pair of differential output signals.

8. The dual-mode signal amplifying circuit (100) of claim 1, wherein the first input signal (IN_P) and the second input signal (IN_N) form a pair of differential input signals, while the first output signal (OUT_P) and the second output signal (OUT_N) form a pair of differential output signals.

* * * * *